US006492866B1

(12) United States Patent
Berg et al.

(10) Patent No.: US 6,492,866 B1
(45) Date of Patent: *Dec. 10, 2002

(54) ELECTRONIC CIRCUIT WITH BULK BIASING FOR PROVIDING ACCURATE ELECTRONICALLY CONTROLLED RESISTANCE

(75) Inventors: Michael Berg, Finkenwerder (DE); Holger Gehrt, Rosengarten (DE)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/064,204

(22) Filed: Apr. 22, 1998

(30) Foreign Application Priority Data

Apr. 25, 1997 (DE) .......................................... 197 17 551
Sep. 24, 1997 (DE) .......................................... 197 42 009

(51) Int. Cl.[7] .............................................. H03K 19/82
(52) U.S. Cl. ........................ 327/581; 327/432; 327/434
(58) Field of Search ................................. 327/534, 404, 327/537, 535, 545, 574, 581, 405, 433, 434, 432

(56) References Cited

U.S. PATENT DOCUMENTS

| | | | | |
|---|---|---|---|---|
| 5,212,415 A | * | 5/1993 | Murakami et al. | 327/534 |
| 5,341,034 A | * | 8/1994 | Matthews | 327/530 |
| 5,345,118 A | | 9/1994 | White et al. | 307/501 |
| 5,748,033 A | * | 5/1998 | Kaveh et al. | 327/545 |
| 5,821,769 A | * | 10/1998 | Douseki | 327/534 |
| 5,892,387 A | * | 4/1999 | Shigehara et al. | 327/537 |

* cited by examiner

Primary Examiner—Terry D. Cunningham
Assistant Examiner—Quan Tra
(74) Attorney, Agent, or Firm—Michael E. Belk

(57) ABSTRACT

A circuit arrangement for generating an electronically controlled electrical resistance by apparatus of at least one MOS transistor. A source-drain junction of the MOS transistor is used for the generation of the electrical resistance between a first and a second terminal, in order to optimize the linearity of the electrical resistance, there have been provided means for generating a bulk signal, which apparatus generate from the voltage on that terminal of the circuit arrangement which is coupled to the source electrode of an associated MOS transistor a signal for driving a bulk electrode of the associated MOS transistor, which signal is generated from the voltage on the terminal and an additionally superposed direct voltage of such a polarity that, depending on the doping type of the MOS transistor the formation of a diode between the source and bulk regions of this MOS transistor is avoided.

10 Claims, 2 Drawing Sheets

ELECTRONIC CIRCUIT WITH BULK BIASING FOR PROVIDING ACCURATE ELECTRONICALLY CONTROLLED RESISTANCE

BACKGROUND OF THE INVENTION

1. Technical Field

The invention relates to the field of precision electronic resistor circuits.

2. Related Art

During the fabrication of signal processing circuits in a BIMOS or CMOS IC the problem arises of fabricating resistors with sufficient accuracy. Moreover, resistors having high resistance values cannot be realized at low cost on such an IC. Related art circuits are known which generate a resistor by electronic means. For this purpose, use is made, for example, of the source-drain path of a MOS transistor. This path forms an electronically generated and electronically controllable resistance between first and second terminals of the circuit arrangement. The known circuit arrangements have the problem that the resistance generated by the MOS transistor is non-linear, (i.e. the resistance value depends on the voltage applied to the terminals). This is caused by the non-linear drain-source characteristic of a MOS transistor. Moreover, such circuit arrangements have the problem that depending on the drive of the source electrode of the MOS transistor its potential can reach the order of magnitude of the bulk voltage of the MOS transistor. In that case, a diode is formed between the bulk region of the transistor and the source electrode or drain electrode, which gives rise to limiting effects and thus causes distortion of the signal passing through the transistor. Before these effects become active the bulk-source/bulk-drain diode produces a non-linearity which increases with the voltage across the controlled resistance. This effect is known as the "backgate effect".

SUMMARY OF THE INVENTION

It is an object of the invention to provide a circuit arrangement of the type defined in the opening paragraph, which operates with the highest possible degree of linearity and in which the formation of capacitively operating diodes within the bulk region is avoided.

According to the invention this object is achieved is provided apparatus for generating a bulk signal, which apparatus generate from the voltage on the terminal of the circuit arrangement which is coupled to the source electrode of an associated MOS transistor a signal for driving a bulk electrode of the associated MOS transistor. Such signal is generated from the voltage on the terminal and an additionally superposed direct voltage of such a polarity that, depending on the doping type of the MOS transistor, the formation of a diode between the source and bulk regions of this MOS transistor is avoided.

A MOS transistor, as used here for the generation of an electronically controlled resistance, has source and drain electrodes of a first doping type. The gate electrode, by means of which the transistor can be controlled, extends between the source and drain electrodes. The transistor as a whole is formed in a so-called bulk region of a second doping type. In operation transistors of this type have the problem that the source potential should always be smaller than the potential of the bulk zone. If, however, both regions have a similar potential a diode is formed between the source electrode and the bulk region, which diode presents a capacitive and d.c. load to the signal applied to the gate electrode of the transistor, as a result of which the signal is distorted or changed.

In order to avoid this undesired effect and to ensure that the transistor always operates in the most linear region of its drain-source characteristic, in accordance with the invention, apparatus is provided for the generation of a bulk signal which ensures that the conducting diode described above is not formed and that the transistor is operated in a region where its operation is as linear as possible. This is achieved in that the apparatus for the generation of a bulk signal generate this signal in such a manner that the bulk signal includes the superposition of the voltage on that terminal of the circuit arrangement which is coupled to the source electrode of the MOS transistor and an additional direct voltage. Thus, in addition, a direct voltage is superposed on the external signal voltage applied to the source electrode of the transistor. This superposed signal is applied to the bulk electrode of the MOS transistor as the bulk signal. Thus, it is achieved that the potential of the bulk electrode and, consequently, of the bulk region of the transistor is always higher than the potential of the source region of the transistor. This also precludes the effect of the capacitive layer of the diode with respect to the bulk.

The result is that the circuit arrangement thus forms an electronically generated resistance whose value is adjustable by the choice of the gate voltage of the transistor and whose value is highly linear and free from undesired capacitive effects.

With an embodiment of the invention it is achieved that also in the case of an asymmetrical drive of the two terminals the circuit arrangement has the above-mentioned advantages without any restriction.

In accordance with a first more specific embodiment, the apparatus for the generation of the bulk signal or bulk signals can advantageously comprise transistors which are suitable for superposing a direct voltage on the bulk signal of the MOS transistor, which direct voltage is in addition to the source signal, which direct voltage can be generated comparatively simply by a diode junction of the transistor.

Similarly, in a second more specific embodiment, the apparatus for generating the bulk signal include a bipolar PNP transistor having its base coupled to one of the terminals of the circuit arrangement, having its collector coupled to the current source. Also, the MOS transistor is a PMOS transistor, the current source is coupled to a positive supply potential and to the bulk electrode of the PMOS transistor whose source-drain junction is used for the generation of the resistance. Thus, the base-emitter potential difference of a bipolar PNP transistor is used for additionally superposing a d.c. potential on the potential for the generation of the bulk signal, which last-mentioned d.c. potential is coupled to the source region of the MOS transistor.

In a third more specific embodiments the means for generating the bulk signal include a bipolar NPN transistor having its base coupled to one of the terminals of the circuit arrangement, having its collector coupled to a positive supply potential and having its emitter coupled to the current source; and the current source is coupled to a supply potential, and to the bulk electrode of a PMOS transistor whose source-drain junction is used for the generation of the resistance.

Similarly in a second more specific embodiment, the means for generating the bulk signal include a bipolar transistor having its base coupled to one of the terminals of the circuit arrangement, having its collector coupled to a reference potential and having its emitter coupled to the current source. Also, the MOS transistor is a PMOS transistor, the current source is coupled to a positive supply potential and to the bulk electrode of the PMOS transistor whose source-drain junction is used for the generation of the resistance.

In a fourth specific embodiment the means for generating the bulk signal include a PMOS transistor having its gate electrode coupled to one of the terminals of the circuit arrangement, having its drain electrode coupled to a reference potential, and having its source and bulk electrodes coupled to the current source. Also, the current source is coupled to a positive supply potential, and to the bulk electrode of a PMOS transistor whose source-drain junction is used for the generation of the resistance.

In a fifth specific embodiment the means for generating the bulk signal comprise an NMOS transistor having its gate electrode coupled to one of the terminals of the circuit arrangement, having its drain electrode coupled to a positive reference potential and having its source and bulk electrodes coupled to the current source. Also, the current source is coupled to a supply potential, and to the bulk electrode of an NMOS transistor whose source-drain junction is used for generation of the resistance.

These fourth and fifth embodiments use PMOS and NMOS transistors in the apparatus for the generation of the bulk signal. In these transistors the gate-source junction is used for the generation of the potential difference. A requirement for the use of MOS transistors is that the bulk electrodes are free.

In a sixth specific example a resistor is arranged in series with the source dain junctions of at least one MOS transistor whose source-drain junction is used for the generation of the resistance. This has the advantage of a further linearity improvement. The resistors provided therein have comparatively small values. However, they ensure that the resistance values to be generated by means of the transistors can be higher. The resistors of comparatively small resistance value can be fabricated in a relatively simple manner in integrated circuits.

BRIEF DESCRIPTION OF THE DRAWINGS

Embodiments of the invention will be described in more detail hereinafter, by way of examples, with reference to the drawings. In the drawings:

FIG. 4 shows another circuit arrangement of the invention similar to FIG. 3.

FIG. 5 shows another circuit arrangement of the invention similar to FIG. 1.

DETAILED DESCRIPTION OF THE EMBODIMENTS

Figure 1:
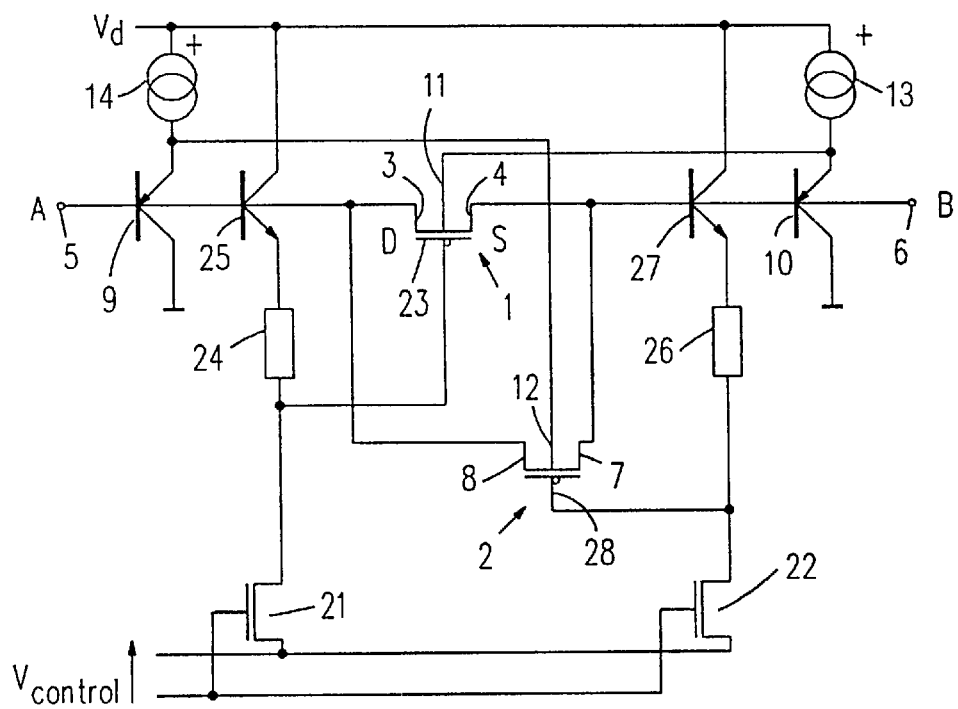
FIG. 1 shows a circuit diagram of the invention, which uses bipolar PNP transistors for the generation of the bulk voltage and PMOS transistors for the formation of the electrically generated resistances.

The circuit arrangement forming the first embodiment shown in FIG. 1 uses a first PMOS transistor 1 and a second PMOS transistor 2 for the formation of the resistance. The source-drain junctions of the two PMOS transistors 1 and 2 are arranged in parallel.

The first PMOS transistor 1 has a source electrode 4 coupled to a second terminal 6 of the circuit arrangement. It further has a drain electrode 3 coupled to a first terminal 5 of the circuit arrangement.

The second PMOS transistor 2 has a source electrode 8 coupled to the first terminal 5 and a drain electrode 7 coupled to the second terminal 6 of the circuit arrangement.

The circuit arrangement shown in FIG. 1 further includes apparatus 10 for generating a bulk signal for the first PMOS transistor 1 and second apparatus 9 for generating a bulk signal for the second PMOS transistor 2. In the present embodiment the apparatus 9 and 10 include bipolar PNP transistors.

The first apparatus 10 for generating the bulk signal for the first PMOS transistor 1 include a PNP transistor which has its collector coupled to a reference potential, its base electrode to the second terminal 6 of the circuit arrangement and to the source terminal 4 of the first PMOS transistor. The emitter of the PNP transistor in the apparatus 10 is coupled to a bulk electrode 11 of the first PMOS transistor. Furthermore, it is coupled to a positive supply potential $V_d$ via a current source 13.

The second apparatus 9 for generating a bulk signal for the second PMOS transistor 2 also include a PNP transistor which is likewise coupled to the reference potential, the first terminal 5, a bulk electrode 12 of the second PMOS transistor 2, and to the positive supply potential via a current source 14.

The PNP transistors in the apparatus 9 and 10 are arranged in such a manner that the voltage across the base-emitter junction (potential difference) is used in order to achieve that the bulk voltages applied to the bulk electrodes 11 and 12 of the transistors 1 and 2, respectively, are an amount equal to this potential difference higher than (added to) the voltages applied to the source electrodes of transistors 1 and 2. The voltage on the second terminal of the circuit arrangement is applied, for example, to the source electrode 4 of the first PMOS transistor 1. Moreover, this voltage, increased by the potential difference across the base-emitter junction of the PNP transistor 10 of the second apparatus, is applied to the bulk electrode 11 of the same PMOS transistor 1. Thus, the bulk electrode 11 of the first transistor 1 receives the same signal as its source electrode but increased by (plus) the potential difference across the base-emitter diode junction of the PNP transistor of the apparatus 10, which potential difference is approximately 0.7 V. Thus, it is achieved that upon any change of the signal appearing on the terminal 6 such a potential difference is obtained between the source and the bulk electrode of the transistor 1 that the formation of a capacitance diode between the source electrode and the bulk region is prevented.

This applies likewise to the second PMOS transistor 2 and the bulk signal generated with the aid of the second apparatus 9.

The circuit arrangement shown in FIG. 1 further includes two NMOS transistor 21 and 22 which have their source electrodes coupled to a reference potential and their gate electrodes to a control potential Vcontrol. The first transistor 21 has its drain electrode coupled to a gate electrode 23 of the first PMOS transistor 1 and, via a resistor 24, to the emitter of a third NPN transistor 25. The third NPN transistor 25 has its base electrode coupled to the first terminal 5 of the circuit arrangement and its collector to the positive supply potential $V_d$. In a corresponding manner, the drain electrode of the second NMOS transistor 22 is coupled to the gate electrode of the second PMOS transistor 2 and, via a resistor 26, to a fourth bipolar NPN transistor 27, arranged similarly to the third bipolar NPN transistor 25, the transistor 27 being coupled to the source electrode 4 of the first PMOS transistor 1.

By means of the control potential Vcontrol the potential on the gate electrodes 23 and 28 of the PMOS transistors 1 and 2 can be controlled, so that the resistances of the of the source-drain junctions of the two transistors 1 and 2 are controllable. In this way, it is possible to adjust the electrically controllable resistance of the circuit arrangement between the terminals 5 and 6 of this circuit.

Figure 2:
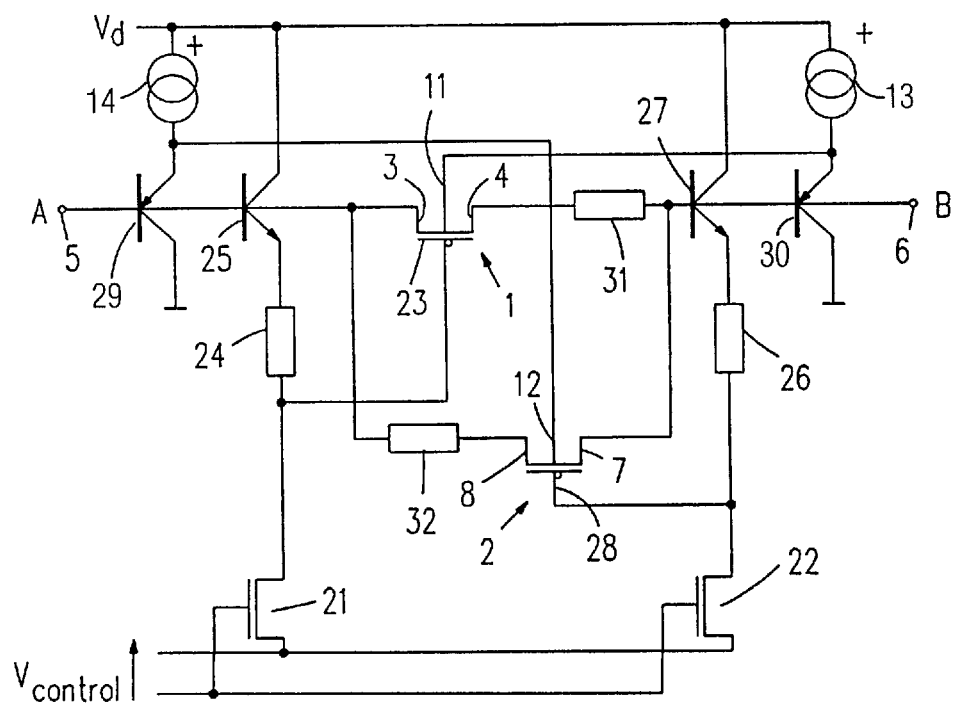
FIG. 2 shows another example circuit arrangement of the invention, in which resistors are arranged in series with the source-drain junctions of the PMOS transistors.

Alternatively, it is possible to use NMOS transistors 33, 34 of FIG. 2 instead of the PMOS transistors 1 and 2 of FIG. 1. Likewise, NPN transistors 29, 30 of FIG. 5 can be used instead of the PNP transistors in bulk signal generating apparatus 9 and 10 of FIG. 1.

FIG. 2 shows another circuit arrangement of the invention. The circuit arrangement of FIG. 2 corresponds closely to that shown in FIG. 1, except that a first resistor 31 is arranged between the source electrode 4 of the first transistor 1 and the second terminal 6 of the circuit arrangement and a second resistor 32 is arranged between the source electrode 8 of the second PMOS transistor 2 and the first terminal 5 of the circuit arrangement.

In this arrangement resistors 31 and 32 are arranged in series with the source-drain junctions of the two PMOS transistors 1 and 2, respectively.

The resistance values of the resistors 31, 32 are then selected to be small in relation to the resistance to be obtained between the terminals 5 and 6. On the one hand, it is thus achieved that the resistors 31 and 32 can still be fabricated comparatively easily on the substrate of an integrated circuit. On the other hand, the resistance values to be generated by means of the source-drain junctions of the two PMOS transistors 1 and 2 must be smaller than for transistors 1 and 2 in FIG. 1. In this way, a further improvement of the linearity of the circuit is achieved.

Figure 3:
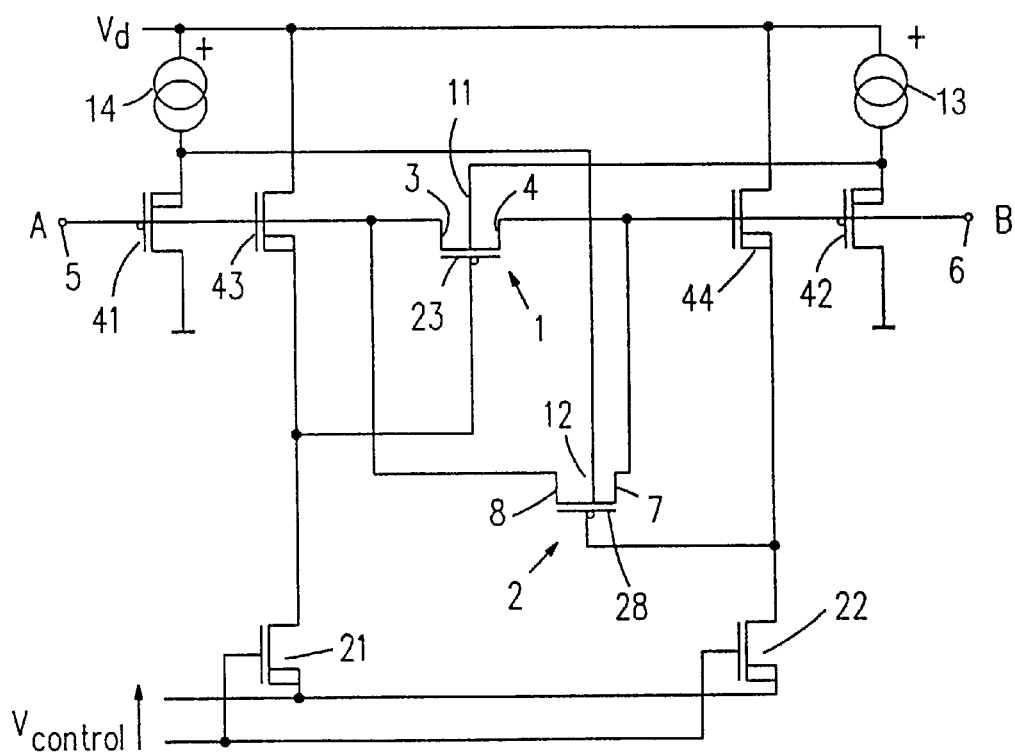
FIG. 3 shows another circuit arrangement of the invention, which employs exclusively MOS transistors.

Another example circuit arrangement of the invention shown in FIG. 3 includes first apparatus 42 for generating the bulk signal and second apparatus 41, which utilize PMOS transistors instead of the bipolar PNP transistors of the embodiments shown in FIGS. 1 and 2. Moreover, the third and fourth bipolar PNP transistors 25 and 27 of the two embodiments shown in FIGS. 1 and 2 have been replaced by NMOS transistors 43 and 44. Thus, the circuit arrangement shown in FIG. 3 can be fabricated wholly in a MOS process but a requirement is that the bulk electrodes of the transistors 41 to 44 are externally accessible.

The PMOS transistor in the first apparatus 42 has its drain electrode coupled to the reference potential and has its gate electrode coupled to the second terminal 6 of the circuit arrangement and to the source electrode 4 of the first PMOS transistor. The source and bulk electrodes of the PMOS transistor in the first apparatus 42 is coupled both to the bulk electrode 11 of the first PMOS transistor 1 and, via a current source 13, to the positive supply potential $V_d$. Thus, it is achieved that the bulk signal is always an amount equal to the potential difference across the gate-source junction of the PMOS transistor higher than (added to) the input signal applied to the second terminal 6 of the circuit arrangement. In this way, the same advantages are obtained as in the circuit arrangement shown in FIG. 1.

Likewise, the PMOS transistor in the second apparatus 41 is coupled to the reference potential, to the first terminal 5 of the circuit arrangement, to the source electrode 8 of the second PMOS transistor 2, to the second bulk electrode 12 of the second PMOS transistor 2 as well as to the supply potential.

In order to make it possible to completely dispense with bipolar transistors in the circuit arrangement shown in FIG. 3, the transistors 25 and 27 in the circuit arrangements shown in FIGS. 1 and 2 have also been replaced by MOS transistors, namely by MOS transistors 43 and 44.

The bulk and source electrodes of the NMOS transistors 43 and 44 are coupled to the respective drain electrodes of the transistors 21 and 22 and the drain electrodes of the transistors 43 and 44 are coupled to the reference potential $V_d$. The gate electrode of the transistor 43 is coupled to the first terminal 5 of the circuit arrangement and the gate electrode of the transistor 44 is coupled to the second gate electrode 6 of the circuit arrangement. In the present embodiment the transistors 43 and 44 together with the transistors 21 and 22 serve for setting the gate potentials of the PMOS transistors 1 and 2 and, consequently, for setting the electrical resistance of the circuit arrangement between the terminals 5 and 6 of this arrangement.

FIG. 4 is similar to FIG. 3 except that NMOS transistors 45 and 46 replace PMOS transistors 41 and 42 of FIG. 3, and NMOS transistors 33 and 46 replace PMOS transistors 1 and The invention has been disclosed with reference to specific illustrative embodiments, to enable those skilled in the art to make and use the invention, and to describe the best mode contemplated for carrying out th invention. Those skilled in the art may modify or add to these embodiments or provide other embodiments without departing from the spirit of the invention. Thus, the scope of the invention is only limited by the following claims:

1. A circuit arrangement for providing an electronically controlled electrical resistance, comprising:

a MOS transistor having a source-drain junction between a source electrode and a drain electrode and also having a bulk electrode;

a first terminal connected to the source electrode and a second terminal connected to the drain electrode, the source-drain junction of the MOS transistor providing the controlled resistance between the first and second terminals; and means for generating a bulk signal for driving the bulk electrode with a voltage from the first terminal and an additionally superposed direct voltage of such a polarity that, depending on the doping type of the MOS transistor, formation of a forward biased diode between the source and bulk regions of the MOS transistor is avoided, the bulk signal generating means comprising bipolar technology, the bulk signal generating means including a current source connected to the bulk electrode, and at least one superposing transistor operationally connected to said current source and said bulk electrode, wherein said superposing transistor provides said superposed direct voltage, which is a characteristic transistor junction potential difference.

2. The arrangement of claim 1, in which two MOS transistors have source-drain junctions arranged in parallel, each source electrode being connected to one of the first and second terminals and each drain electrode to the other of the first and second terminals so as to form the electrically controllable resistance, each MOS transistor being associated with a respective one of first and second means for generating a bulk signal, of which the first means generate a bulk signal from the voltage on the first terminal for the MOS transistor associated with the first means, and the second means generate a bulk signal from the voltage on the second terminal for the MOS transistor associated with the second means.

3. The arrangement of claim 1, in which the means for generating the bulk signal include transistors.

4. The arrangement of claim 1, in which:
the current source is connected to a reference potential; and
the means for generating the bulk signal comprise an NMOS transistor having its gate electrode coupled to one of the terminals of the circuit arrangement, having its drain electrode coupled to a positive supply potential and having its source and bulk electrodes coupled to the current source and to the bulk electrode of the NMOS transistor whose source-drain junction is used for providing the resistance.

5. A circuit arrangement for providing an electronically controlled electrical resistance, comprising:
a PMOS transistor having a source-drain junction between a source electrode and a drain electrode and also having a bulk electrode;
a first terminal connected to the source electrode and a second terminal connected to the drain electrode, the source-drain junction of the PMOS transistor providing the controlled resistance between the first and second terminals; and
means for generating a bulk signal for driving the bulk electrode with a voltage from the first terminal and an additionally superposed direct voltage of such a polarity that, depending on the doping type of the PMOS transistor, formation of a forward biased diode between the source and bulk regions of the PMOS transistor is avoided, the bulk signal generating means including a current source connected to the bulk electrode wherein the current source is coupled to a positive supply potential, and further wherein the means for generating the bulk signal include a bipolar PNP transistor having its base coupled to one of the terminals of the circuit arrangement, having its collector coupled to a reference potential, and having its emitter coupled to the current source and to the bulk electrode of the PMOS transistor that is used for providing the resistance.

6. A circuit arrangement for providing an electronically controlled electrical resistance, comprising:
a PMOS transistor having a source-drain junction between a source electrode and a drain electrode and also having a bulk electrode;
a first terminal connected to the source electrode and a second terminal connected to the drain electrode, the source-drain junction of the PMOS transistor providing the controlled resistance between the first and second terminals; and
means for generating a bulk signal for driving the bulk electrode with a voltage from the first terminal and an additionally superposed direct voltage of such a polarity that, depending on the doping type of the PMOS transistor, formation of a forward biased diode between the source and bulk regions of the PMOS transistor is avoided the bulk signal generating means comprising biopolar technology, the bulk signal generating means including a current source connected to the bulk electrode, said current source having a current source output, said current source output being independent of a voltage applied across said current source, wherein the current source is coupled to a positive supply potential, and further wherein the means for generating the bulk signal include a PMOS transistor having its gate electrode coupled to one of the terminals of the circuit arrangement, having its drain electrode coupled to a reference potential, and having its source and bulk electrodes coupled to the current source and to the bulk electrode of the PMOS transistor whose source-drain junction is used for providing the resistance.

7. A circuit arrangement for providing an electronically controlled electrical resistance, comprising:
a MOS transistor having a source-drain junction between a source electrode and a drain electrode and also having a bulk electrode;
a first terminal connected to the source electrode and a second terminal connected to the drain electrode, the source-drain junction of the MOS transistor providing the controlled resistance between the first and second terminals; and
means for generating a bulk signal for driving the bulk electrode with a voltage from the one of the terminals and an additionally superposed direct voltage of such a polarity that, depending on the doping type of the MOS transistor, formation of a forward biased diode between the source and bulk regions of the MOS transistor is avoided;
and in which a resistor is arranged in series with the source drain junctions of the MOS transistor whose source-drain junction is used for providing the resistance.

8. A circuit arrangement for providing an electronically controlled electrical resistance, comprising:
a PMOS transistor having a source-drain junction between a source electrode and a drain electrode and also having a bulk electrode;
a first terminal connected to the source electrode and a second terminal connected to the drain electrode, the source-drain junction of the PMOS transistor providing the controlled resistance between the first and second terminals; and
means for generating a bulk signal for driving the bulk electrode with a voltage from the first terminal and an additionally superposed direct voltage of such a polarity that, depending on the doping type of the PMOS transistor, formation of a forward biased diode between the source and bulk regions of the PMOS transistor is avoided, the bulk signal generating means including a current source connected to the bulk electrode wherein the current source is coupled to a reference potential, and further wherein the means for generating the bulk signal include a bipolar NPN transistor having its base coupled to one of the terminals of the circuit arrangement, having its collector coupled to a positive supply potential, and having its emitter coupled to the current source and to the bulk electrode of the PMOS transistor whose source-drain junction is used for providing the controlled resistance.

9. A circuit arrangement for providing an electronically controlled electrical resistance, comprising:
a MOS transistor having a source-drain junction between a source electrode and a drain electrode and also having a bulk electrode, the source-drain junction being used for providing the controlled resistance;
a first terminal connected to the source electrode and a second terminal connected to the drain electrode, the source-drain junction of the MOS transistor providing the controlled resistance between the first and second terminals; and means for generating a bulk signal for driving the bulk electrode with a voltage from the one of the terminals and an additionally superposed direct voltage of such a polarity that, depending on the doping type of the MOS transistor, formation of a forward biased diode between the source and bulk regions of the MOS transistor is avoided, the bulk signal generating means including bipolar transistor with a base connected to one of the terminals and an emitter connected to the bulk electrode.

10. A circuit arrangement for providing an electronically controlled electrical resistance, comprising:

a MOS transistor having a source-drain junction between a source electrode and a drain electrode and also having a bulk electrode;

a first terminal connected to the source electrode and a second terminal connected to the drain electrode, the source-drain junction of the MOS transistor providing the controlled resistance between the first and second terminals;

means for generating a bulk signal for driving the bulk electrode with a voltage from the one of the terminals and an additionally superposed direct voltage of such a polarity that, depending on the doping type of the MOS transistor, formation of a forward biased diode between the source and bulk regions of the MOS transistor is avoided; and control means for controlling the controllable resistance connected to the gate of the MOS transistor, the control means including a resistor connected to the gate of the MOS transistor.

* * * * *